United States Patent
Batlogg et al.

(10) Patent No.: US 7,135,438 B1
(45) Date of Patent: Nov. 14, 2006

(54) METHOD OF MAKING CUPRATE SUPERCONDUCTING MATERIAL

(75) Inventors: Bertram Josef Batlogg, New Providence, NJ (US); Robert Joseph Cava, Basking Ridge, NJ (US); Robert Bruce van Dover, Berkeley Heights, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 08/049,751

(22) Filed: Apr. 19, 1993

Related U.S. Application Data

(63) Continuation of application No. 07/021,229, filed on Mar. 3, 1987, now Pat. No. 6,635,603, which is a continuation of application No. 07/001,682, filed on Jan. 9, 1987, now abandoned.

(51) Int. Cl.
*C04B 101/00* (2006.01)
(52) U.S. Cl. ............... 505/126; 505/490; 505/500; 505/725; 505/742
(58) Field of Classification Search ........... 505/1, 505/725, 742, 780, 779, 778, 777, 126, 490, 505/500, 815; 423/593
See application file for complete search history.

(56) References Cited

U.S. PATENT DOCUMENTS 6,635,603 B1 * 10/2003 Batlogg et al. ............ 505/126
6,638,894 B1 * 10/2003 Batlogg et al. ............ 505/126

OTHER PUBLICATIONS

Hor, P. H. et al., "High-Pressure Study of the New Y-Ba-Cu-O Superconducting Compound System", *Phys. Rev. Lett.*, vol. 58, No. 9, pp. 911-912, Mar. 2, 1987.

Michel, C. et al., "Oxygen intercalation in mixed valence copper oxides related to the perovskites", Rev. Chim. Miner., 21, No. 4, pp. 407-425, 1984.

Rhyne, JJ., et al., "Phonon Density of Superconducting $YBa_2Cu_3O_7$ and The Non-Superconducting Analog $YBa_2Cu_3O_B$", *Physical Review B.*, 36(4), Aug. 1, 1987.

Shaplygin I.S., et al., "Preparation and Properties of The Compounds $Ln_2 C_uO_4$ (Ln=La, Pr, Nd, Sm, Eu, Gd) and Some of Their Solid Solutions", *Russian-Journal of Inorganic Chem.*, 24, (6), pp. 820-824, 1979.

M. K. Wu et al., "Superconductivity at 93K in a New Mixed-phase Y-Ba-Cu-O Compound System at Ambient Pressure", *Phys. Rev. Lett.*, vol. 58, No. 9, pp. 908-910, 1987. [Referred to in motions in Interference 101,961, as Chu Reference No. 1.].

P. H. Hor et al., "High-Pressure Study of the New Y-Ba-Cu-O Superconducting Compound System", received by *Phys. Rev. Lett.*, Feb. 6, 1987, revised manuscript received by *Phys. Rev. Letters*, Feb. 16, 1987, Published *Phys. Rev. Lett.*, vol. 58, No. 9, pp. 911-912, 1987. [Referred to in motions in Interference 101,981 as Chu Reference No. 2].

C. W. Chu et al., "Superconductivity at 98K In The Y-Ba-Cu-O Compound System at Ambient Pressure", submitted to *Phys. Rev. Lett.* In Feb. 1987, [Referred to in motions in Interference 101,981, as Chu Reference No. 3].

* cited by examiner

*Primary Examiner*—Mark Kopec
(74) *Attorney, Agent, or Firm*—E. E. Pacher; M. I. Finston

(57) ABSTRACT

A class of superconductive materials containing copper-oxygen bonding and with mixed cation-occupancy designed with a view to size and valence consideration yield useful values of critical temperature and other properties. Uses entail all applications which involves superconducting materials such as magnets and transmission lines which require continuous superconductivity paths as well as detectors (e.g., which may rely on tunneling).

7 Claims, 5 Drawing Sheets

METHOD OF MAKING CUPRATE SUPERCONDUCTING MATERIAL

CROSS-REFERENCE TO RELATED APPLICATION

This application is a CON of Ser. No. 07/021,229 (filed Mar. 3, 1987, now U.S. Pat. No. 6,635,603), which application is a CON of Ser. No. 07/001,682 (filed Jan. 9, 1987, now ABN).

BACKGROUND OF THE INVENTION

This invention relates to superconductive material and apparatus and systems utilizing such material. Characteristics of preferred compositions herein give rise to apparatus design advantages. Such characteristics include useful values of critical temperature and critical magnetic field. Certain of the compositions are free of characteristics which have been associated with radiation damage in prior materials.

The field of superconductivity has had a varied history from its beginnings—from the discovery of the phenomenon by Kamerlingh Onnes in 1911. Implications of extreme practical significance were apparent from the start. Workers became enchanted with the thought of lossless transmission as well as implications on magnetic and other apparatus. The concept that has received so much attention in recent years—that of "permanent" magnets of extremely high field values useful e.g. for containment of fusion reactions—was not overlooked.

Advances in obtaining material with improved properties have been discontinuous. Experiments following the first discovery, while certainly substantiating the concept, established need for extremely low temperatures, i.e., low values of transition temperatures, $T_c$. Mercury ($T_c$~4 K) was discovered first, and lead ($T_c$~7 K) was discovered to be superconducting shortly thereafter.

There was little achievement either experimentally or in theoretical terms following the initial period until the 1940's when work on NbN yielded a $T_c$ value of about 16 K. Evolution and description of the concept was not broadly and effectively disseminated because of its German origin and circumstances surrounding World War II. A significant period of inquiry began subsequent to World War II. From the mechanistic standpoint, the most significant advance entailed identification of Type II superconductivity (Ginzburg and Landau, 20 Zh. Eksperim. i Teor. Fiz., pg. 1064 (1950)).

From a mechanistic-theoretical standpoint 1957 marks a most significant advance in understanding of superconductivity. The Bardeen Cooper Schrieffer Theory (for which a Nobel prize was subsequently awarded), (108 Phys. Rev., pg. 1175 (1957)) gave rise to the understanding which has been implicit in all studies to the present time. Intensive worldwide effort was established by the activity of B. T. Matthias of Bell Laboratories and J. K. Hulm of Westinghouse resulting in the most significant A15 compounds exemplified by $Nb_3Sn$. This was followed by identification of the members as well as of related alloy compositions generally containing Nb. This work gave renewed hope of practical applications working with a refrigerant more effective than liquid helium. Materials developed during this period continue to be studied extensively, and indeed serve very significant technological functions, e.g., in particle accelerators.

Efforts to develop materials with significantly higher values of $T_c$ than that of $Nb_3Sn(T_c=18$ K) were disappointing. Probably the culmination was the $T_c$ value of ~23.2 K for $Nb_3Ge$ in 1973 by L. Testardi at Bell Laboratories and J. R. Gavaler at Westinghouse.

The subsequent decade resulted in little advance in terms of $T_c$. Extensive study of a new category of material was, however, very important and plays a vital role in development of this invention. This study entailed compositions of barium bismuth lead oxide ($BaPb_{1-z}Bi_zO_3$). B. Batlogg, Physica 126B, 275 (1984). Most significant, compositions in this category while attaining $T_c$ values of only up to 13 K depended upon metal-oxygen bonding for superconductivity.

Most recent origins of the present invention are traceable to the extremely significant work reported by IBM Zurich—J. G. Bednorz and K. A. Muller (64 Z. Phys. B.—Condensed Matter, pp. 189 (1986)). Report of onset $T_c$ values in the 30 K range in the La—Ba—Cu—O system stimulated intense activity by a number of groups worldwide.

Significant consequences of work stimulated by the above are reflected in recent articles.

Workers at the University of Tokyo in Japan J. Appl. Phys., significantly advanced understanding of the IBM work by identification of the superconducting phase as being of the $K_2NiF_4$ structure. The composition on which measurements were made in accordance with this publication was that of the IBM Zurich report.

C. W. Chu and co-workers at the University of Houston reported on the beneficial effect of application of hydrostatic pressure during measurement in Phys. Rev. Lett., 58, 405 (1987). In a revision to this article made subsequent to the original submission date, comment was made on the substitution of strontium for barium.

The same issue of Phys. Rev. Lett., 58 at page 408, reported true bulk conductivity at 39.2 K in the composition $La_{1.85}Sr_{0.15}CuO_4$. This finding constitutes a portion of the disclosure in parent U.S. patent application Ser. No. 001, 682, filed Jan. 9, 1987.

The published works were accompanied and followed by a series of tantalizing rumors reporting "onset" temperatures well above the 77 K boiling point of liquid nitrogen. The March 2 issue of Phys. Rev. Lett., (Vol. 58, 1987), contains two extremely significant papers representing advances prompted by the new findings. At page 908 et seq., workers at the Universities of Alabama and Houston report on compositions in the Y—Ba—Cu—O system evidencing $T_c$ values well above 77 K. Their exemplary composition $(Y_{0.6}Ba_{0.4})_2CuO_{\leq 4}$ is described as multiple phase ("instead of the pure $K_2NiF_4$ phase" [associated with previously reported compositions]). Reporting a deviation in resistivity from the usual temperature relationship which is initiated at 93 K, the paper goes on to report attainment of zero resistivity at 80 K. Rather than associated attainment of this value with the particular crystallographic phase, authors state " . . . high temperature superconductivity may be associated with interfacial manifestations". At page 911 in the same issue of Phys. Rev. Lett., the same authors in a separate article reached the specific conclusion "It is therefore evident that . . . above 77 K [$T_c$] may not be identified with . . . perovskite or . . . tetragonal layered structures . . . " Developments to date have taken on the drama of an international race with runners representing essentially every organization in any way affiliated with superconductivity. Events to date are reflected in an article on page 12 of the Star-Ledger for Tuesday, Mar. 3, 1987. In this article, world-famous physicist John Rowell, Assistant Vice President of Bell Communications Research, reports as their "international contribution" the " . . . producing results identical to those achieved in general by scientists at the University of Houston . . . ". Dr. Rowell explicitly confirms the multiphase nature of the superconducting material and, in fact, reports that "Only about 2% . . . is superconducting . . . "

SUMMARY OF THE INVENTION

The invention takes the form of identification and isolation of the single crystallographic phase responsible for the superconducting characteristics that have been the subject of the world-wide quest. In a general sense, identification is of a perovskite or near-perovskite (referred to collectively as "perovskite") phase of specific corn position. All included materials of the "perovskite" class are primarily pure quaternary or partially substituted quaternary copper oxides. Nominal compositions—all single phase "perovskite"— may be represented by the general formula $M_2M'_1Cu_3O_{g-\delta}$. All included materials are based on a nominal 2:1 atomic ratio of divalent:trivalent cation inclusion in the M site. From the compositional standpoint, consistent with prior reported work, preferred materials of the invention are those in which M is predominantly barium and M' is predominantly yttrium, although total substitutions, as will be seen from the examples herein, have yielded significant, albeit somewhat lower, critical temperature, $T_c$ values.

Inventive implications apply to essentially all superconducting apparatus. The inventive findings in terms of preferred compositions have already provoked restudy of long-distance power transmission now made possible at liquid nitrogen temperatures. Other implications, of course, arise from the higher values of critical field with implications to fusion reaction containment, for example. Such purposes are consistent with materials characterized by continuous superconducting paths. Other purposes also well-known to prior workers include use in devices such as detectors and those dependent on tunneling phenomena such as Josephson junction devices as well as other devices which depend on weakly coupled superconductors and/or in the large value of the superconducting gap.

DETAILED DESCRIPTION

Figure 1:
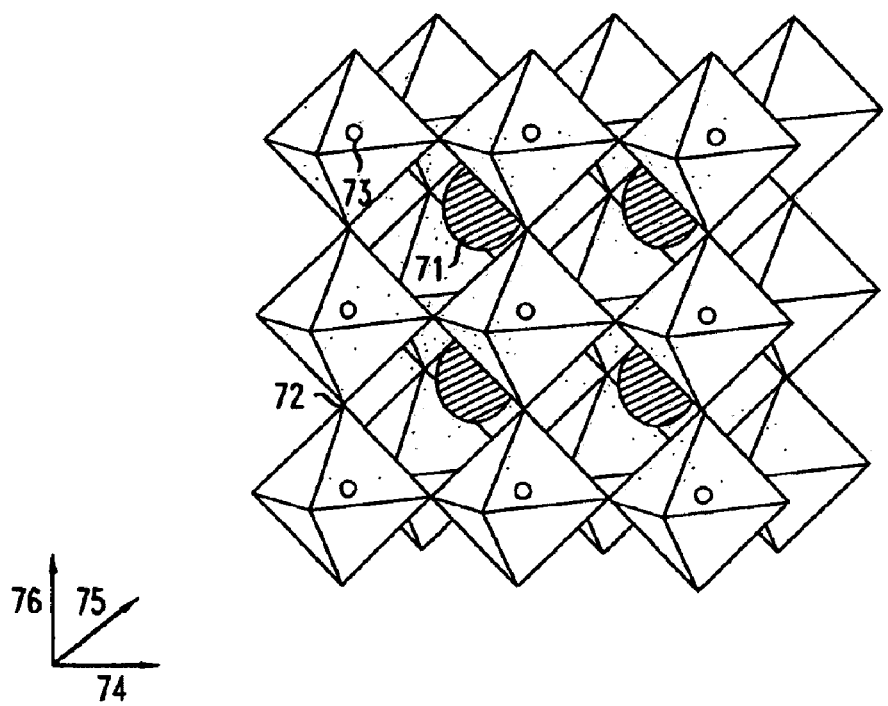
FIG. 1 is a diagrammatic representation of the ideal cubic perovskite structure. As described further on, it serves as a basis for structures in this invention which may entail distortions to lower symmetry and/or deviations from nominal stoichiometry.

Most significantly, the invention is characterized in terms of identification of essentially single phase material. Two factors played significant roles in identification and in the ability to reliably produce single phase material of the ascribed superconducting characteristics. It is appropriate to describe the inventive advance in terms of two aspects: (1) structure of the phase, and (2) composition (identification of which was essential to isolation of (1)).

Structure

Materials of the invention are essentially single phase. By this it is meant that the materials herein are single phase to at least 95 mole percent as determined by powder x-ray diffraction. The particular value, 95 percent, is chosen as corresponding with the expected measurement precision of ordinary apparatus-procedures.

It is most significant that the single phase so identified is "perovskite". The quoted term as used herein is meant to include not only the prototype, truly cubic material, but very significantly distortions therefrom. A preferred category of materials herein show a specific form of distortion of such preferred materials (materials having the higher $T_c$ values) while variables share in common a magnitude such that observation of the distortion is observed on ordinary instrumentation as used in x-ray powder diffraction.

There are two significant compositional contributions to the structure. These are discussed in more detail in a following section relating (a) to observed oxygen deficiencies which reduces the coordination number of a portion of the copper from six to five or possibly four, and (b) mixed occupancy of the "A site" (in the prototypical representation $ABO_3$), i.e., occupancy by ions represented as M and M' in the general formula above—gives rise to a further variation. X-ray diffraction studies, in indicating single phase material, translate into substantial ordering of M and M' ions which, in turn, gives rise to a unit cell size larger than that of the primitive cell corresponding with the single formula unit $ABO_3$. X-ray diffraction measurements of a preferred composition—nominal $Ba_2YCu_3O_{g-\delta}$ indicate a crystallographic unit "subcell" of tetragonal symmetry of size a=5.49 and c=7.65 Angstroms. By "subcell" it is meant that the true elementary crystallographic cell ("supercell") may be found to be of larger volume due to subtle ordering or distortion effects whose diffraction signatures are too weak to be observed by conventional x-ray powder diffraction techniques. Such subcell/supercell relationships are well known in perovskite structure type materials.

It is essential to the invention that materials meet all structural criteria as set forth in this section. Those familiar with the development of superconductivity will recognize the significance of the identification of the highly symmetrical perovskite structure. The relationship has most importantly been observed experimentally and more recently has been explained in theoretical terms, for example, in terms of band theory. The relationship plays a role in the Bardeen Cooper Schrieffer (BCS) theory of superconductivity.

Composition

It is noteworthy that a site occupancy (relative numbers of M and M' ions) represents a large departure from the compositions (of the mixed phase materials) which have received so much attention. In fact, the nominal ratio of 2:1 for M:M' ions is nearly the inverse of the ratio in the materials reported thus far (of the mixed phase) materials which provoked world-wide inquiry. In terms of critical temperature, $T_c$, preferred compositions are those in which M is primarily barium and in which M' is primarily yttrium. As is seen from the Examples, partial substitutions, e.g. at the 25 mole percent level, do not substantially affect $T_c$ in many instances. Total substitution, for example of lanthanum for yttrium, while still resulting in the "perovskite" structure, shows a significant drop in $T_c$, in fact to levels which no longer permit use of liquid nitrogen at atmospheric pressure.

The 2:1 A site occupancy is considered essential to materials of the invention. Experiments thus far with compositions deviating by as little as 10 percent, result in multiphase material. Such materials, i.e., those with deviations of 10 percent or greater, are not within the scope of the present invention.

The present invention is importantly premised on identification of a reproducible preparation of single phase material. It has been indicated that the 2:1 A site occupancy gives rise to a unit cell containing more than a single $ABO_3$ unit. Partial substitutions, e.g., at the 25 mole percent level as reported in the Examples, give no x-ray indication of deviation—such materials continue to be identified as single phase. It is observed, however, that partial substitution, like total substitution, gives rise to some change in the degree and type of distortion from cubic perovskite. Again, it has generally been observed that reduction in distortion corresponds with some lessening in $T_c$.

Consistent with reported results pertaining to the mixed phase materials, it is concluded that barium and yttrium are ideal M, M' occupants. Substitution, whether partial or total, is preferably by ions that approach the size of the ions that are replaced. Materials of the Examples are consistent in depending upon partial substitution of yttrium by the next smaller trivalent ion, scandium, or the next larger trivalent ion, lanthanum. Even the totally substituted $Ba_2La$ nominal composition with its significantly reduced $T_c$ is the consequence of such a substitution. Substitution of the divalent ion in the M site also meets such size criteria. One such material described in the Examples entails 25 mole percent substitution of the divalent alkaline earth ion barium by the next smaller alkaline earth ion of strontium.

Oxygen Deficiency

It is well known that copper-based perovskites can be—generally are—oxygen deficient. Materials of the invention which have been examined are no exception. Measurements made in the usual manner (thermogravimetric analysis using hydrogen reduction at 950° C.) yield values of 6 (in the formula $M_2M'Cu_3O_{g-\delta}$) of 2.3±0.4. As in the materials described in the parent application Ser. No. 001,682, filed Jan. 9, 1987, conductivity is largely dependent upon electrons yielded by the coexistence of both divalent and trivalent copper. The observed oxygen stoichiometry yields an average copper valence centering about 2.13. As discussed under "Material Preparation", average valence state is dependent upon processing conditions. Specifically varying the temperature and time of oxygen anneal varies this quantity.

Material Preparation

Material specification in accordance with the invention depends upon the nature of the intended use. For power transmission, or any other current-carrying application, it is required that there be a continuous superconducting path. For detector and other device use (e.g., Josephson junction devices) in which tunneling might be permitted or even required, it is necessary only that there be sufficient superconducting phase to satisfy such use.

Processing

For many purposes, it is an advantage of the invention that fabrication of superconducting elements may utilize standard ceramic processing.

Appropriate starting materials are mixtures of metallic oxides, hydroxides, carbonates, hydrates, oxalates or other reactive precursors in the appropriate ratio to obtain the desired final composition. Starting material may be produced by wet or dry mixing, by co-precipitation of materials from solution, or by any other method which results in intimate mixture of reactive particles.

Mixtures of starting materials can be fired in air, oxygen or other non-reducing ambient at temperatures sufficient to facilitate chemical reaction between constituents and to begin formation of the desired phase. Typical firing temperatures are between approximately 700 and 950 C. for times of between a few hours and several days until the desired phase is either fully or partially produced. The "calcined" material is then formed into the ceramic body of desired shape by standard ceramic processing techniques such as hot or cold pressing, extrusion, slipcasting, or other such technique appropriate to the geometry of the desired (green body) object.

The material in final form is fired at a temperature sufficiently high to complete chemical reaction of components ("reactive sintering") if not accomplished in step (2) and for densification. This "sintering" is conducted so as to reduce voids to the point where the density of the ceramic body is sufficient to allow obtaining favorable electrical and mechanical properties. For most favorable results, the material is fired in an ambient environment with greater partial pressure of $O_2$ than that of air (0.2 atm.). However, material fired in air may have acceptable superconducting properties. (Air is not the desired processing environment since the use of too high a temperature may result in undue oxygen loss and consequently degradation of properties.)

While the description above is important for many purposes, material preparation may take other forms. An alternative is preparation of thin films for Josephson Junction and other devices. Workers in the field know of many film-forming procedures, e.g., magnetron sputtering, diode sputtering, reactive ion sputtering, ion-beam sputtering and other thin film deposition techniques including evaporation. "Conductor" structures may take on the form of continuous strands, however produced. Initial formation may utilize techniques as applied to other brittle glass-like material. In this approach, the structure reverts to one that is crystalline before attainment of superconductivity. One technique which has been applied to other brittle superconductors entails extrusion within a protective sheathing of copper or other ductile material.

Since the material is oxidic another approach may entail formation of an alloy of the designated metals followed by oxidation.

Generalized Preparatory Approach as Used in the Examples

Here the procedure followed in each of the numbered examples is set forth:

1) starting materials are powders of lanthanum hydroxide, strontium carbonate, calcium oxide, copper oxide, barium oxide, yttrium oxide and scandium oxide. While much of the work entailed relative high purity, many rare earths contain finite amounts of other rare earths which are difficult to remove. It is noteworthy that high purities are not required for preparation of suitable material.

2) starting materials are weighed in appropriate quantities to yield the desired composition. They are then further pulverized in a mortar and pestle.
3) materials from step 2 are then fired (for comparison purposes reported examples used a temperature of 950° C. for a period of approximately 16 hours).
4) in some cases the materials were pulverized and then refired in air or oxygen for 16 hours.
5) Materials are pulverized and pressed dry into shape suitable for experimentation at a pressure of between 5,000 and 10,000 psi. (In the examples reported the shape was that of a disc of approximately 1 cm diameter and 1 mm thick.
6) The discs are next fired at a temperature of 950° C. for two hours in oxygen.
7) Materials are allowed to cool to ambient room temperature in flowing oxygen gas.

As stated, the above conditions were for purpose of comparison. Other preliminary work has established the value of varying many of the conditions set forth. For example, the repeating of step 4 to assure a degree of uniformity can be omitted—may even desirably be omitted. Clearly, the temperatures stated are non-critical, the requirement being only that the required composition-phase is produced in sufficient quantity as described. Consistent with the description above, other considerations may dictate deliberate abbreviation in processing to avoid production of pure single-phase material.

The technique used to identify the nature of the final material is set forth: a portion of the finally annealed disc is pulverized, and a powder X-ray diffraction pattern is made. The particular technique used was powder diffractometry, although other techniques such as Debye-Scherrer or Guinier photography may also be employed. (B. D. Cullity, *Elements of X-Ray Diffraction*, Addison-Wesley Publ. Co., Inc., Reading, Mass. (1978)).

THE EXAMPLES

Examples are expressed in terms of the final nominal compositions and measured properties. These compositions and properties are summarized in the Table.

The characteristic terms in which the Examples are defined are set forth below. Examples 1, 2 and 3 differ one from the other solely in terms of the atmosphere used during anneal. In Example 1, the atmosphere was oxygen at 1 atmosphere of pressure, in Example 2, it was air also at 1 atmosphere, in Example 3, the anneal atmosphere was oxygen at 3 atmospheres of pressure.

Properties

Description of transition temperatures, $T_c$, in the literature has not been free of ambiguity. Frequently measured results are in terms of: (1) ($T_c$ onset) what is usually called "onset temperature" which is in itself ambiguous. The term is intended to signify the first anomaly in a measured characteristic indicative of superconductivity (examples include variations in the slope of resistivity v. temperature, decrease of magnetic susceptibility, etc.), (2) ($T_c$ midpoint) the resistive midpoint i.e. the resistance value which is ½ that of the onset and absolute zero values, (3) ($T_c R=0$) more meaningful measure directly indicative of true superconductivity, i.e. resistance-less conduction of current (zero resistance), and (4) ($T_c M$) the most stringent measure (as reported herein) involving the expulsion of magnetic flux. (By this technique the fraction of the volume which is superconducting may be determined.)

Materials produced in accordance with the examples were found to have the values of $T_c$ given in the Table. (Many of the materials prepared in the examples were measured by more than one of the described techniques as indicated above.

In all instances reported in the examples, product was established as exhibiting a perovskite structure. Again, for comparative purposes, it was found useful to select examples in which the sample was substantially single-phase.

FIG. 1 presents the atomic arrangement of the unit cell of materials of the perovskite structure type. The structure has been described in detail in standard references. The symbols of the type marked by 71 are representative of the positions of the A site atoms in the prototype material; the corners of the octahedra as marked by 72 are representative of the oxygen atoms; and symbols of the type marked 73 are

TABLE

COMPOSITIONS AND SUPERCONDUCTING TRANSITION TEMPERATURES FOR EXAMPLE MATERIALS

| Example | Composition | $T_c^{onset}$ | $T_c^{midpoint}$ | $T_c^{R=0}$ | $T_c^M$ |
|---|---|---|---|---|---|
| 1. | $Ba_2YCu_3O9-\delta$ | 93.5 | 93.0 | 91.5 | 90.0 |
| 2. | $Ba_2YCu_3O_9-\delta$ | 88 | 72 | 55 | |
| 3. | $Ba_2YCu_3O_9-\delta$ | 88 | 81 | 72 | |
| 4. | $Ba_{1.5}Sr_{0.5}YCu_3O_9-\delta$ | 89 | 87 | 86 | |
| 5. | $Ba_2Y_{0.75}Sc_{0.25}Cu_3O_9-\delta$ | 93 | 92 | 87 | |
| 6. | $Ba_2LaCu_3O_9-\delta$ | 49 | 34 | 25 | |
| 7. | $Ba_2Y_{0.75}La_{0.25}Cu_3O_9-\delta$ | 92 | 87 | 82 | | representative of the copper atoms. The unit cell represented in the Figure has cubic symmetry, that is, that the elementary repeat distances in the directions denoted by arrows marked 74, 75 and 76 are equal in length to each other. There are many distortions and types of nonstoichiometry in perovskites which are detailed in standard references. Most of the compositions herein are tetragonal, but Example 2 is cubic or nearly so.

Figure 2:
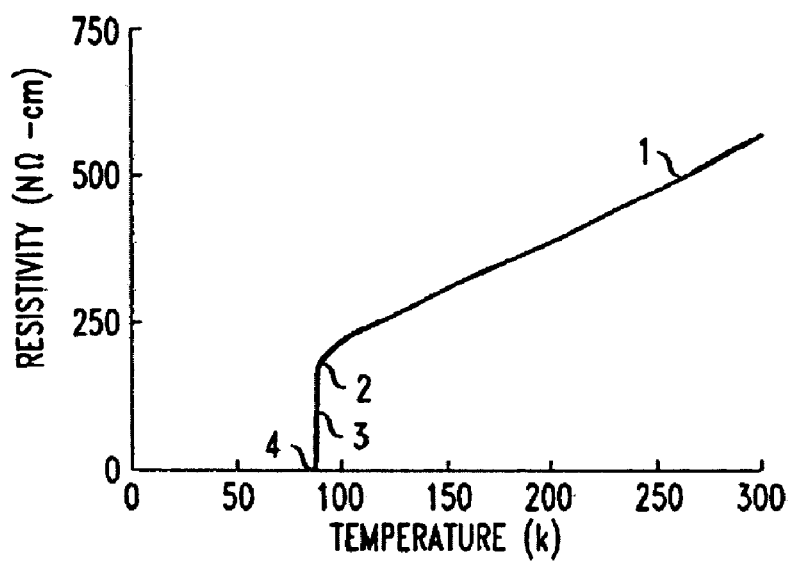
FIGS. 2 and 3, on coordinates of resistivity and temperature, plot characteristics of materials made in accordance with the Examples on different coordinate scales. The curve form is useful in identification of the various values of $T_c$ as the term is used in the art.

FIG. 2 is illustrative of the resistive technique for measuring superconductivity. The resistivity measurement ρ is made by a standard 4-point probe. The abscissa units are temperature in Kelvin, K. It is seen that curve 1 follows a constant slope upon decrease of temperature to about 110 K, below which the resistivity decreases more quickly, followed by a more abrupt break 2 indicative of onset of superconductivity. Point 3 is the "mid-point resistive" value, in this instance occurring at 93 K. Point 4 represents the temperature at which all resistance to the flow of electricity occurs and is 91.5 K in this sample.

Figure 3:
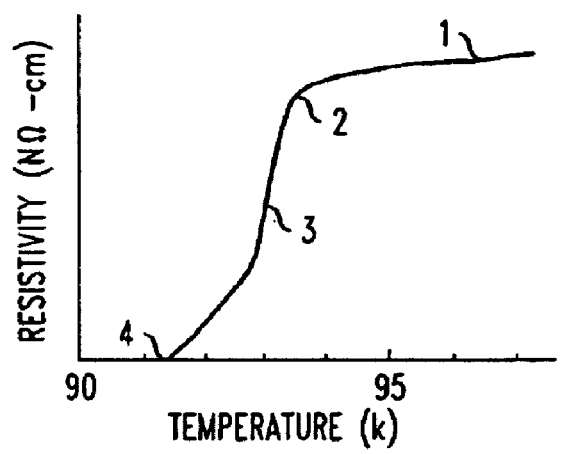
Figure 4:
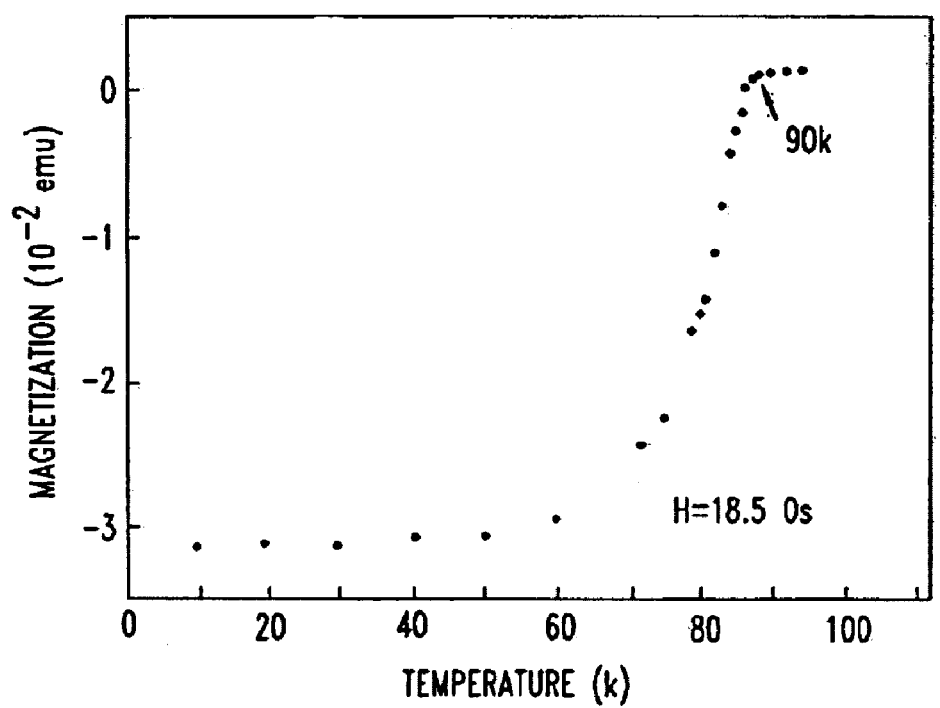
FIG. 4, on coordinates of magnetization and temperature, shows development of (superconductive) diamagnetic response, again, as plotted for typical materials produced in accordance with the Examples.

FIG. 3 is a blowup of FIG. 2 showing the same features in more detail. FIG. 4, in units of magnetization on the ordinate in terms of $10^{-2}$ emu versus temperature in Kelvin on the abscissa, are illustrative of the results of magnetization measurements. The particular sample is that of Example 1. The procedure followed for this Example and for all others reported involved first cooling the sample to 4 K, a magnetic field was then applied and the temperature increased while measuring the magnetization in a commercial SQUID magnetometer. For the particular sample plotted, the field applied was 18.5 Oe resulting in a magnetization of $3\times10^{-2}$ emu at 10 K and sharply turned up to become positive above 90 K.

Figure 5:
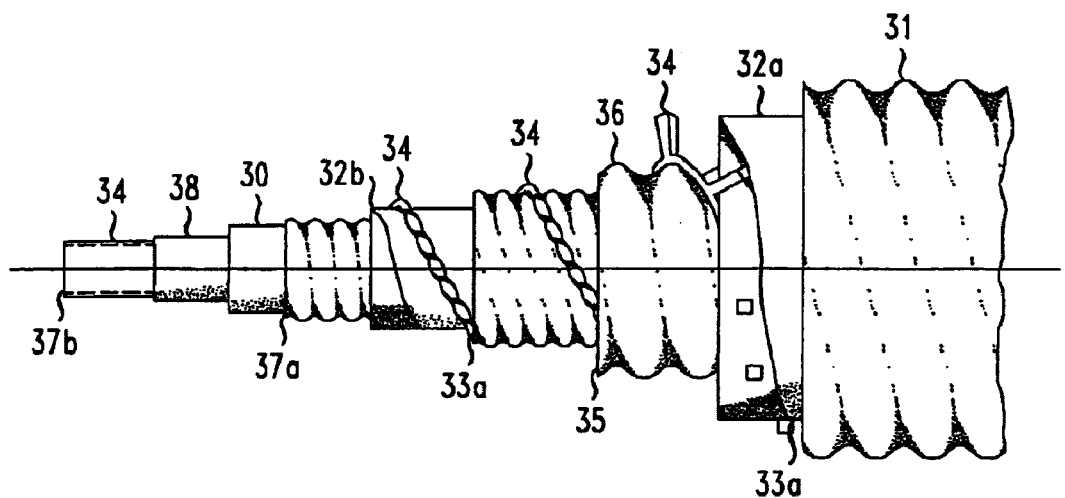
FIG. 5 depicts a cable design incorporating a superconducting element of an inventive composition.

In FIG. 5, the structure shown is described in detail in G. Bogner, "Large Scale Applications of Superconductivity", in *Superconductor Application: SQUIDS and Machines*, B. B.

Figure 6:
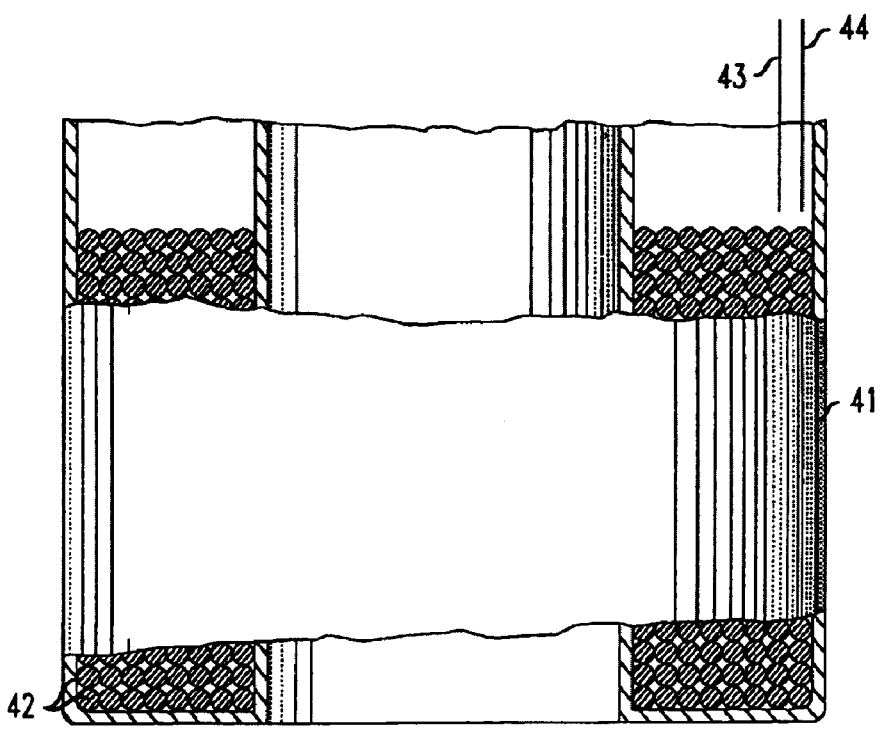
FIG. 6 depicts a superconducting solenoid.
Figure 7:
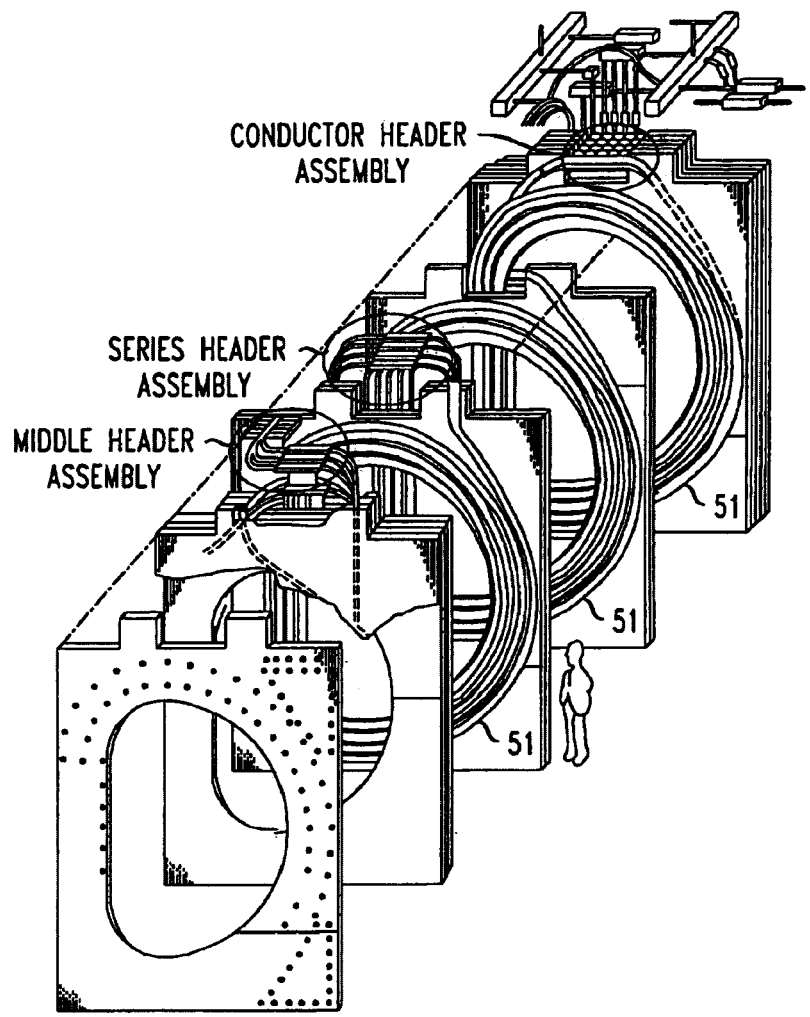
FIG. 7 represents a superconducting torus suitable for use for fusion reaction confinement.

Schwartz and S. Foner, eds. (Plenum Press, New York, 1977). Briefly, structure depicted consists of an outer sheathing 31, thermal insulation layers 32a and 32b, evacuated annular regions 33a and 33b, spacers 34, nitrogen-filled annular region 35, heat shield 36, and coolant regions 37a and 37b (it is a feature of the inventive structure that coolant may consist of liquid nitrogen in contradistinction with the liquid helium or hydrogen required of earlier structures). Element 38 is a superconductor material in accordance with the invention. FIG. 6 shows an annular cryostat 41 filled with liquid nitrogen and containing turns 42 of a material herein. Terminal leads 43 and 44 are shown emerging from the coil. Magnetic test structure of FIG. 7 is described in R. A. Hein and D. U. Gubser, "Applications in the United States", in *Superconductor Materials Science: Metallurgy, Fabrication, and Applications*, S. Foner and B. B. Schwartz, eds., (Plenum Press, New York, 1981). The superconducting element shown as windings 51 are made of a material herein. The structure is considered exemplary of those expected to find broad-scale use for containment of fusion reaction.

Figure 8:
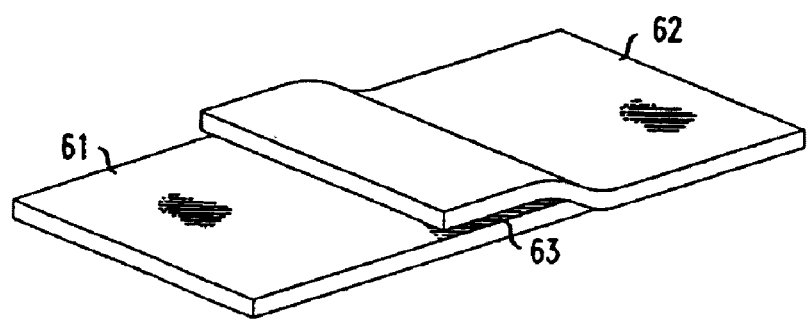
FIG. 8 shows a Josephson junction device illustrative of devices dependent upon superconducting tunneling.
Figure 9:
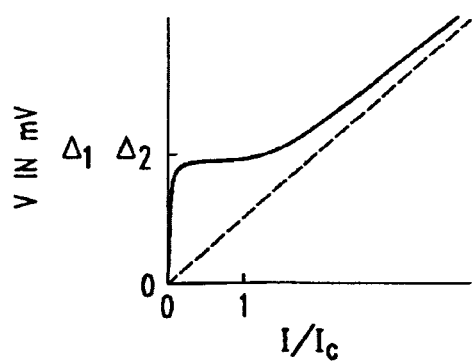
FIG. 9 shows the current-voltage characteristics of the device of FIG. 8.

FIGS. 8 and 9 depict the IV characteristic (9) of the Josephson junction device shown schematically in 8. The structure consists of two superconducting layers 61 and 62 separated by a tunneling barrier 63. Use of material of the invention (not necessarily identical) for 61 and 62 permit usual Josephson action at higher temperatures than previously permitted. Josephson junction devices are described in M. R. Beasley and C. J. Kircher "Josephson Junction Electronics: Materials Issues and Fabrication Techniques", ibid.

What is claimed is:

1. A method of producing a substantially single phase superconducting material of chemical composition $M_2M'Cu_3O_y$, having $T_c$ (R=0) of 82 K or above, with M being Ba and M' being selected from Y, Y and La, and Y and Sc, the method comprising the steps of:

a) mixing stoichiometric quantities of particles of copper oxide, one or more of Y oxide, Sc oxide and La hydroxide, and a Ba-compound selected from Ba oxide and Ba carbonate, such that an intimate mixture results;

b) calcining said intimate mixture at a predetermined temperature in the approximate range 700–950° C. in an oxygen-containing environment for a time sufficient to result in calcination of substantially the entire mixture;

c) pulverizing the calcined material of step b);

d) forming said pulverized calcined material into a shape;

e) sintering said shape in an oxygen-containing environment at a temperature of about 950° C. for a time sufficient for substantial densification to occur; and f) cooling said sintered shape in an oxygen-containing environment at a rate selected to yield said substantially single phase superconducting material having $T_c$ (R=0) of 82 K or above.

2. Method of claim 1, wherein M' is Y.

3. Method of claim 2, wherein at least 95 mole % of the material is material of composition $Ba_2YCu_3O_y$, with y in the range 6.3–7.1.

4. Method of claim 1, wherein said oxygen-containing environment comprises an atmosphere with an oxygen partial pressure greater than 0.2 atmospheres.

5. Method of claim 4, wherein the oxygen partial pressure is about 1 atmosphere.

6. Method of claim 1, wherein steps b) and c) are repeated at least once.

7. Method of claim 1, wherein step f) comprises allowing the shape to cool to ambient temperature in flowing oxygen gas.

* * * * *